US009173293B2

(12) United States Patent
Nagahara et al.

(10) Patent No.: US 9,173,293 B2
(45) Date of Patent: Oct. 27, 2015

(54) MEMORY MODULE AND VIDEO CAMERA

(75) Inventors: Yasuyuki Nagahara, Kanagawa (JP); Isao Ozawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 13/406,892

(22) Filed: Feb. 28, 2012

(65) Prior Publication Data

US 2012/0210049 A1  Aug. 16, 2012

Related U.S. Application Data

(63) Continuation of application No. PCT/JP2010/065078, filed on Aug. 27, 2010.

(30) Foreign Application Priority Data

Aug. 28, 2009  (JP) ................. 2009-198373

(51) Int. Cl.
*G06F 12/00* (2006.01)
*H05K 1/18* (2006.01)
*G06F 17/50* (2006.01)
(Continued)

(52) U.S. Cl.
CPC ............ *H05K 1/181* (2013.01); *G06F 12/0246* (2013.01); *G06F 17/5045* (2013.01); *G06F 17/5068* (2013.01); *G06F 17/5072* (2013.01); *G06F 17/5077* (2013.01); *G06F 17/5081* (2013.01); *G11C 29/48* (2013.01); *G11C 5/04* (2013.01); *G11C 16/00* (2013.01); *G11C 2029/5602* (2013.01); *H05K 1/0268* (2013.01); *H05K 2201/10159* (2013.01);
(Continued)

(58) Field of Classification Search
CPC ............ G06F 12/0246; G06F 17/5045; G06F 17/5068; G06F 17/5072; G06F 17/5077; G06F 17/5081
USPC .................................................. 716/119, 137
See application file for complete search history.

(56) References Cited

U.S. PATENT DOCUMENTS 6,555,755 B1 * 4/2003 Yanagisawa ................... 174/254
6,757,751 B1 * 6/2004 Gene .............................. 710/36
(Continued)

FOREIGN PATENT DOCUMENTS

JP         8-98398        4/1996
JP         898398 A  *    4/1996
(Continued)

OTHER PUBLICATIONS

Protel 99 Designer's Handbook, 1999, Protel International Pty Ltd., pp. 488 and 578.*

(Continued)

*Primary Examiner* — Shawn X Gu
(74) *Attorney, Agent, or Firm* — Oblon, McClelland, Maier & Neustadt, L.L.P.

(57) ABSTRACT

According to the embodiments, there are provided semiconductor memories that are mounted individually on two sides of a mounting board; a controller that is mounted either on an obverse side or a reverse side of the mounting board, and performs read and write control of the semiconductor memories; and a connector that is deviated in a lateral direction from the controller so as not to overlap the controller, is mounted either on the obverse side or the reverse side of the mounting board, and transfers a signal exchanged between the controller and outside.

16 Claims, 7 Drawing Sheets

(51) Int. Cl.
  *G06F 12/02* (2006.01)
  *G11C 29/48* (2006.01)
  G11C 5/04 (2006.01)
  G11C 16/00 (2006.01)
  G11C 29/56 (2006.01)
  H05K 1/02 (2006.01)

(52) U.S. Cl.
  CPC ............... *H05K 2201/10189* (2013.01); *H05K 2201/10545* (2013.01); *H05K 2203/162* (2013.01)

(56) References Cited

U.S. PATENT DOCUMENTS

| | | | |
|---|---|---|---|
| 2003/0223284 A1* | 12/2003 | Isa et al. | 365/200 |
| 2005/0078057 A1* | 4/2005 | Chang et al. | 345/55 |
| 2006/0131430 A1* | 6/2006 | Ito | 235/492 |
| 2006/0220204 A1 | 10/2006 | Wada et al. | |
| 2007/0086035 A1 | 4/2007 | Wheless et al. | |
| 2007/0156932 A1 | 7/2007 | Kasahara et al. | |
| 2009/0063895 A1* | 3/2009 | Smith | 714/7 |
| 2009/0093136 A1 | 4/2009 | Hiew et al. | |
| 2009/0171613 A1* | 7/2009 | Tsukazawa | 702/130 |
| 2009/0218670 A1 | 9/2009 | Yamamoto et al. | |

FOREIGN PATENT DOCUMENTS

| | | | |
|---|---|---|---|
| JP | 2002-198383 | | 7/2002 |
| JP | 2002198383 A | * | 7/2002 |
| JP | 3093308 | | 5/2003 |
| JP | 3093308 U | * | 5/2003 |
| JP | 2006-302278 | | 11/2006 |
| JP | 2009-206429 | | 9/2009 |

OTHER PUBLICATIONS

Combined Taiwanese Office Action and Search Report issued Mar. 4, 2014 in Patent Application No. 099129054 (with English translation of Office Action).

Office Action issued on Jul. 30, 2014 in the corresponding Taiwanese Patent Application No. 099129054 (with English Translation).

International Search Report mailed Nov. 2, 2010 in PCT/JP2010/065078 filed Aug. 27, 2010 (in English).

International Written Opinion mailed Nov. 2, 2010 in PCT/JP2010/065078 filed Aug. 27, 2010.

* cited by examiner

MEMORY MODULE AND VIDEO CAMERA

CROSS-REFERENCE TO RELATED APPLICATIONS

This application is based upon and claims the benefit of priority from International Application No. PCT/JP2010/065078, filed on Aug 27 and Japanese Patent Application No. 2009-198373, filed on Aug. 28, 2009; the entire contents of all of which are incorporated herein by reference.

FIELD

Embodiments described herein relate generally to a memory module and a video camera.

BACKGROUND

Along with miniaturization of a memory module, the pin pitch of a connector used for the external connection has become smaller. For this reason, when a cable for testing is frequently inserted into and removed from a connector for the purpose of testing the memory module, the connector may wear out or collect metallic particles thereon, which sometimes causes poor contact of the connector.

For example, Japanese Unexamined Patent Application Publication No. 2006-302278 discloses a method for mounting a semiconductor chip for memory and a semiconductor chip for controller on a main surface of a base substrate for a semiconductor memory card and electrically connecting test pads to the semiconductor chip for memory through wiring of the base substrate.

DETAILED DESCRIPTION

In general, according to one embodiment, the memory module is provided with semiconductor memories, a controller, and a connector. The semiconductor memories are mounted on both sides of a mounting board. The controller is mounted on an obverse side of the mounting board or a reverse side of the mounting board and performs read/write control of the semiconductor memories. The connector is mounted on the obverse side of the mounting board or the reverse side of the mounting board in a manner laterally deviated from the controller so as not to overlap the controller and transfers signals exchanged between the controller and the outside.

Exemplary embodiments of memory module will be explained below in detail with reference to the accompanying drawings. The present invention is not limited to the following embodiments.

[First Embodiment]

Figure 1:
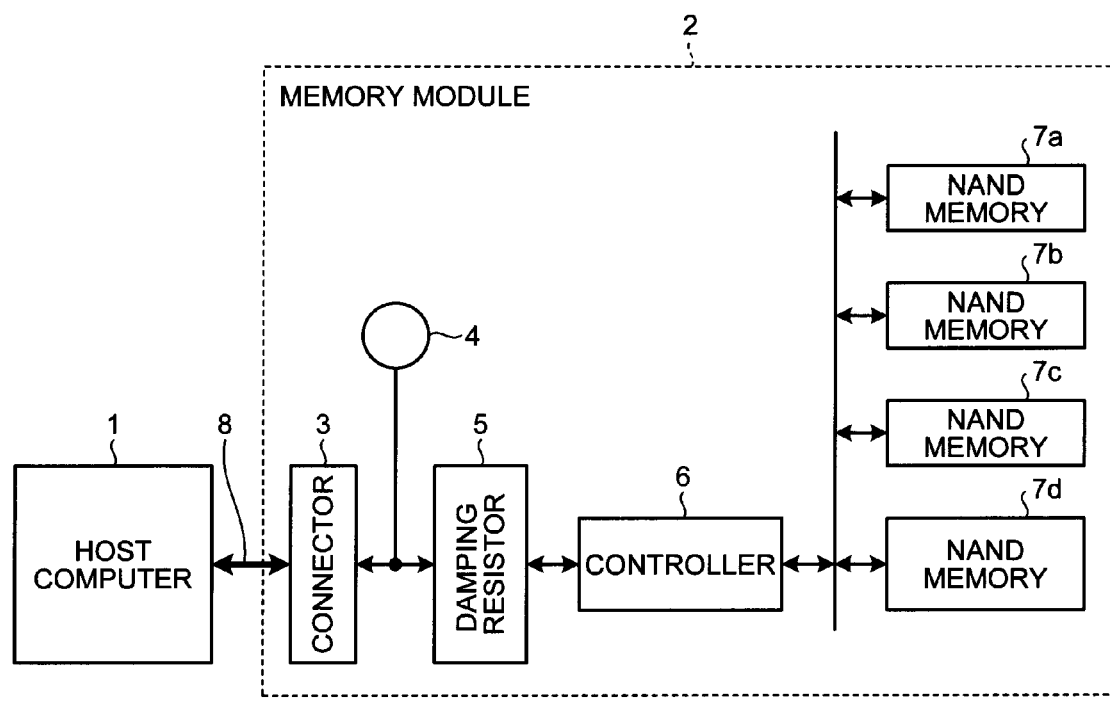
FIG. 1 is a block diagram illustrating an outline configuration of a memory module according to a first embodiment.

FIG. 1 is a block diagram illustrating an outline configuration of a memory module according to a first embodiment.

In FIG. 1, a memory module 2 is provided with a connector 3, test pads 4, a damping resistor 5, a controller 6, and NAND memories 7a-7d. The connector 3 is connected to the controller 6 through the damping resistor 5, and the test pads 4 are drawn out from a connection between the connector 3 and the damping resistor 5. Further, the controller 6 is connected to the NAND memories 7a-7d.

NAND flash memories can be used as the NAND memories 7a-7d, and it is possible to provide thereto a unit cell array, a decoder, a sense amplifier, a charge pump circuit, a page buffer, and so on. The connector 3 can transfer control signals, data signals, and the like that are exchanged between the controller 6 and the outside. Test pads 4 can transfer test signals that are exchanged between the controller 6 and the outside. The damping resistor 5 can attenuate a spike-like waveform included in a signal input to the controller through the connector 3 or the test pads 4. A plurality of NAND flash memory chips may be stacked and contained in the NAND memories 7a-7d individually. For example, by laying four NAND memory chips on top of one another and accommodating them altogether, it is possible to increase the memory capacity by four times with the occupied area almost the same as that required when one NAND flash memory chip is used.

The controller 6 can control writing and reading to and from the NAND memories 7a-7d. Specifically, the controller 6 can perform, as a process specific to the NAND memories 7a-7d, wear leveling or defective block processing. In addition, the controller 6 may be provided with an ECC function for error detection and correction. It is also possible to provide a DRAM or the like used for writing into the NAND memories 7a-7d at once by collecting a certain amount of write data so that the substantial write endurance of the NAND memories 7a-7d is prolonged.

When the memory module 2 is tested, the test signals are input to the controller 6 via the test pads 4. Here, when the test signals are input to the test pads, the spike-like noise is attenuated by the damping resistor 5 and input to the controller 6. Then, a response resulted from inputting the test signals to the controller 6 is obtained through the test pads 4 to thereby determine whether writing and reading to and from the NAND memories 7a-7d are performed normally. This way, the memory module 2 is determined good or bad.

On the other hand, when the memory module 2 is used as an external storage device of a host computer 1, a cable 8 is inserted into the connector 3 to thereby connect between the host computer 1 and the memory module 2. When write data is sent from the host computer 1 to the memory module 2, the write data is sent to the controller 6 by way of the connector 3 and the damping resistor 5 and written into the NAND memories 7a-7d through the controller 6.

Figure 2A:
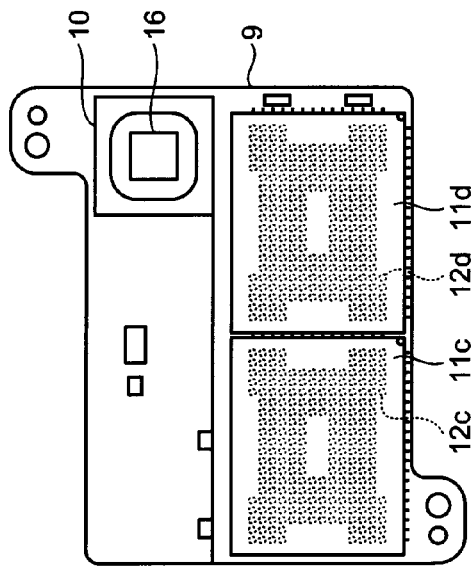
FIGS. 2A to 2C are diagrams illustrating an external structure of the memory module 2 of FIG. 1.
Figure 2B:
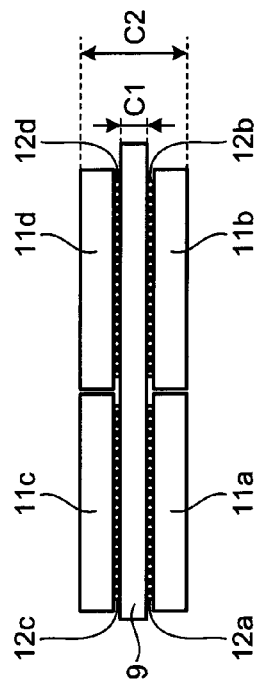

FIG. 2A is a plan view showing an external structure of the memory module 2 of FIG. 1; FIG. 2B is a rear view showing an external structure of the memory module 2 of FIG. 1; and FIG. 2C is a cross sectional view of the memory module 2 of FIG. 1 cut along a portion of the NAND memories 7a-7d.

Figure 2C:
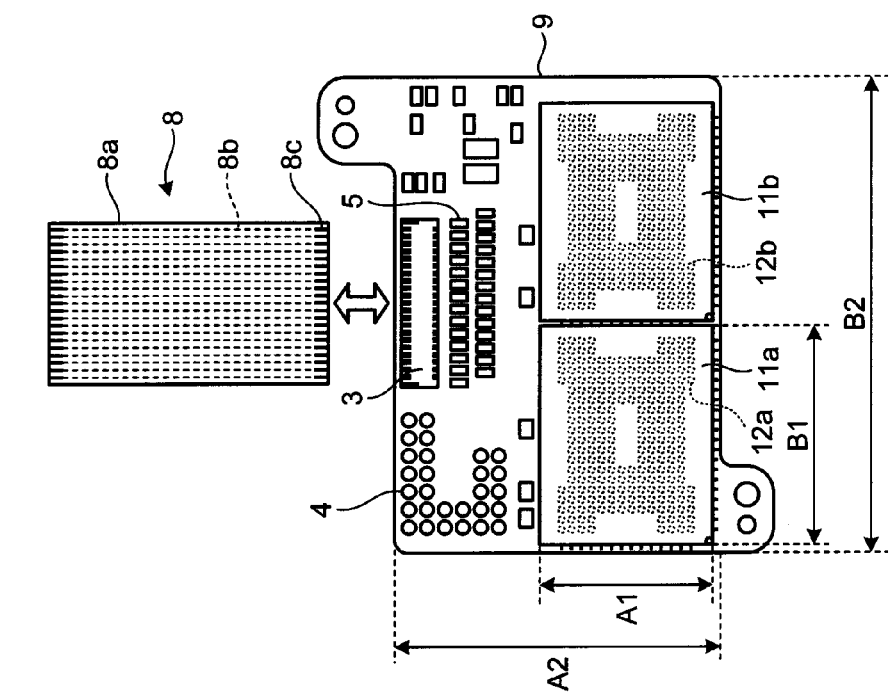

In FIGS. 2A to 2C, NAND memory BGAs (ball grid arrays) 11a and 11b are mounted on the obverse side of the mounting board 9 by way of solder balls 12a and 12b, respectively, and, at the same time, NAND memory BGAs 11c and 11d are mounted on the reverse side of the mounting board 9 by way of solder balls 12c and 12d, respectively. Here, the NAND memory BGAs 11a and 11b can be mounted on one side of the mounting board 9 and the NAND memory BGAs 11c and 11d can be mounted on the other side of the mounting board 9 in a manner opposing each other. The memories 7a-7d illustrated in FIG. 1 can be mounted on the NAND memory BGAs 11a-11d, respectively. As a material of the mounting board 9, for example, PCB (polychlorinated biphenyl) can be used.

The connector 3 is mounted and the test pads 4 are formed on the mounting board 9. The damping resistor 5 is also mounted on the same face where the connector 3 is mounted. Here, it is preferable that the surfaces of the test pads 4 be coated with gold plating. It is also preferable that the number of pins of the connector 3 is arranged at 39 or more, and the pin pitch of the connector 3 be arranged in a range from 0.3 mm to 0.5 mm. A semiconductor chip 16 for controller is mounted on the reverse side of the mounting board 9 and sealed with an encapsulating resin 10 to thereby form a COB (Chip On Board). It is possible to incorporate the controller 6 illustrated in FIG. 1 into the semiconductor chip 16 for controller. The semiconductor chip 16 for controller is mounted on the reverse side of the mounting board 9 beside the NAND memories 11c and 11d.

The connector 3 is mounted on the mounting board 9 in a manner laterally deviated from the semiconductor chip 16 for controller so that they do not overlap each other. The test pads 4 are arranged on the mounting board 9 in a lateral direction beside the connector 3.

For example, a depth A1 and a width B1 of the NAND memory BGAs 11a-11d may be set at 14 mm and 18 mm, respectively. It is also possible, for example, to set a depth A2, a width B2, and a thickness C1 of the mounting board 9 at 28 mm, 39 mm, and 0.6 mm, respectively. A combined thickness C2 of the NAND memory BGAs 11a and 11c and the mounting board 9 may be set, for example, at 3.7 mm or smaller. A capacity of the NAND memories 7a-7d may be set, for example, at 128 gigabytes, and the memory module 2 may be arranged to be compatible with an SD card.

The cable 8 that can be inserted into and removed from the connector 3 has wiring 8b that is retained by a carrier tape 8a. Both ends of the carrier tape 8a have individual external terminals 8c connected to the wiring 8b. It is possible to use, for example, polyimide as a material of the carrier tape 8a, and Cu as a material of the wiring 8b and the external terminals 8c. Further, it is preferable that gold plating is applied to the surface of the external terminals 8c. The carrier tape 8a may be arranged to have flexibility.

In this arrangement, the semiconductor chip 16 for controller is mounted by COB technology in a manner laterally deviated from the connector 3 to prevent overlapping, and the NAND memory BGAs 11a-11d are mounted on both sides and the semiconductor chip 16 for controller. With this arrangement, it is possible to increase the capacity of the memory that can be mounted on the mounting board 9 and miniaturize the memory module 2. Further, by mounting the NAND memory BGAs 11a-11d on both sides of the mounting board 9, it is possible to perform a unit test on the NAND memories 7a-7d shown in FIG. 1 before they are mounted on the mounting board 9. This makes it possible to mount only the NAND memories 7a-7d that have passed the test and increase manufacturing yield of the memory module 2.

Also, by forming the test pads 4 on the mounting board 9, it is no longer necessary to insert and remove the cable 8 into and from the connector 3 when the memory module is tested. This arrangement makes it possible to prevent the connector 3 from wear and attracting metallic particles thereon, which contributes to reducing instances of poor contact even when the pin pitch of the connector 3 is narrowed.

Referring to the embodiment illustrated in FIG. 2, the description was given of the method for mounting the semiconductor chip 16 for controller on a side opposite to the mounting side of the connector 3. However, it is also possible to mount the semiconductor chip 16 for controller on the same side where the connector 3 is mounted. Further, referring to the embodiment illustrated in FIG. 2, the description was given of the method for forming the test pads 4 on the same side where the connector 3 is mounted. However, it is also possible to eliminate the test pads 4. Referring to the embodiment illustrated in FIG. 2, the description was given of the method for mounting the damping resistor 5 on the same side where the connector 3 is mounted. However, it is also possible to mount the damping resistor 5 on a side opposite to the mounting side of the connector 3. Referring to the embodiment illustrated in FIG. 2, the description was given of the method for forming the BGAs to mount the NAND memories 7a-7d shown in FIG. 1 and mounting them on the mounting board 9. However, it is also possible to mount, by COB technology, semiconductor chips in which NAND memories 7a-7d shown in FIG. 1 are individually formed. Further, in the embodiment described above, the description was given of the method to mount the NAND memories 7a-7d on the mounting board 9. However, it is also possible to mount, on the mounting board 9, a semiconductor memory such as the ReRAM or the PCRAM instead of the NAND memories 7a-7d.

Figure 3:
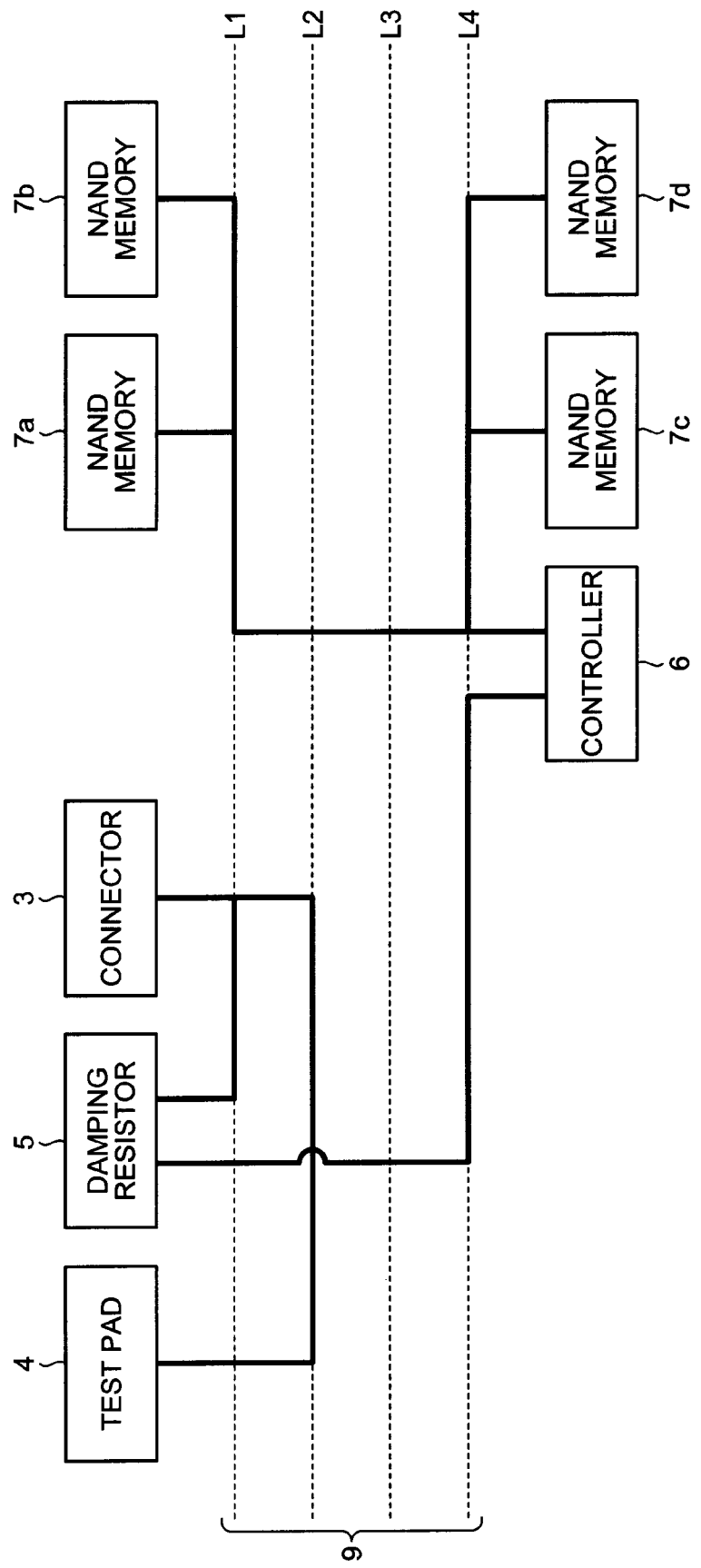
FIG. 3 is a cross sectional view illustrating an outline arrangement of internal wiring layers of the memory module 2 of FIG. 2.

FIG. 3 is a cross sectional view illustrating an outline arrangement of internal wiring layers of the memory module 2 of FIG. 2.

Referring to FIG. 3, the mounting board 9 shown in FIG. 2 can be formed of, for example, a four-layer board. In such a case, first and fourth layers can be used as wiring layers, a second layer can be used as a ground layer, a third layer can be used as a power supply layer. In addition, connection wiring between the test pads 4 and the connector 3 can be also formed in the second layer. It is also possible to connect the damping resistor 5 and the NAND memories 7a and 7b to the controller 6 via through holes formed in the mounting board 9, and connect the NAND memories 7c and 7d to the controller 6 via the wiring layer formed in the fourth layer.

With this arrangement, by using the second layer as the ground layer and the third layer as the power supply layer, it is possible to position the ground layer and the power supply layer between the wiring layers, which makes it possible to stabilize the power potential.

By forming the connection wiring between the test pads 4 and the connector 3 in the second layer, it is possible to connect between the test pads 4 and the connector 3 using a part of the ground layer. For this reason, it is possible to prevent the wiring connecting the test pads 4 and the connector 3 to the controller 6 from becoming complicated. This makes it possible to increase the memory capacity that can be mounted on the mounting board 9.

Figure 4:
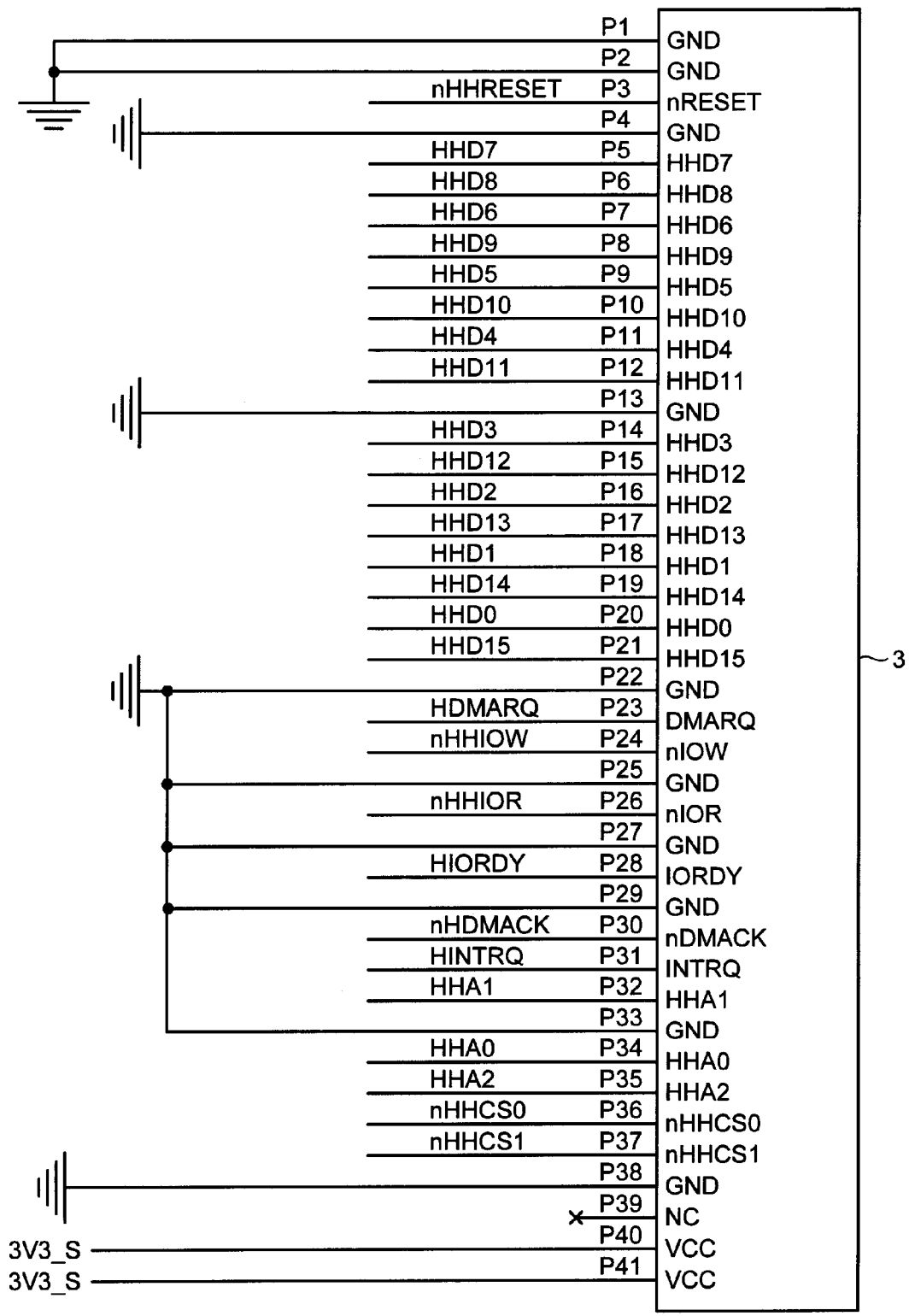
FIG. 4 is a diagram showing one example of names of signals transmitted to individual pins of a connector 3 of FIG. 2.

FIG. 4 is a diagram showing one example of names of signals transmitted to individual pins of the connector 3 of FIG. 2.

Referring to FIG. 4, the connector 3 shown in FIG. 2 can be provided with 41 pins, i.e., P1-P41. The pins P1, P2, P4, P13, P22, P25, P27, P29, P33, and P38 can be connected to the ground. The pins P40 and P41 can be connected to the power supply. Signals for controlling the operation of the system can be input to the pins P3, P24, P26, P28, P30, P32, and P34-P36. Data signal can be input to the pins P5-P21.

Figure 5:
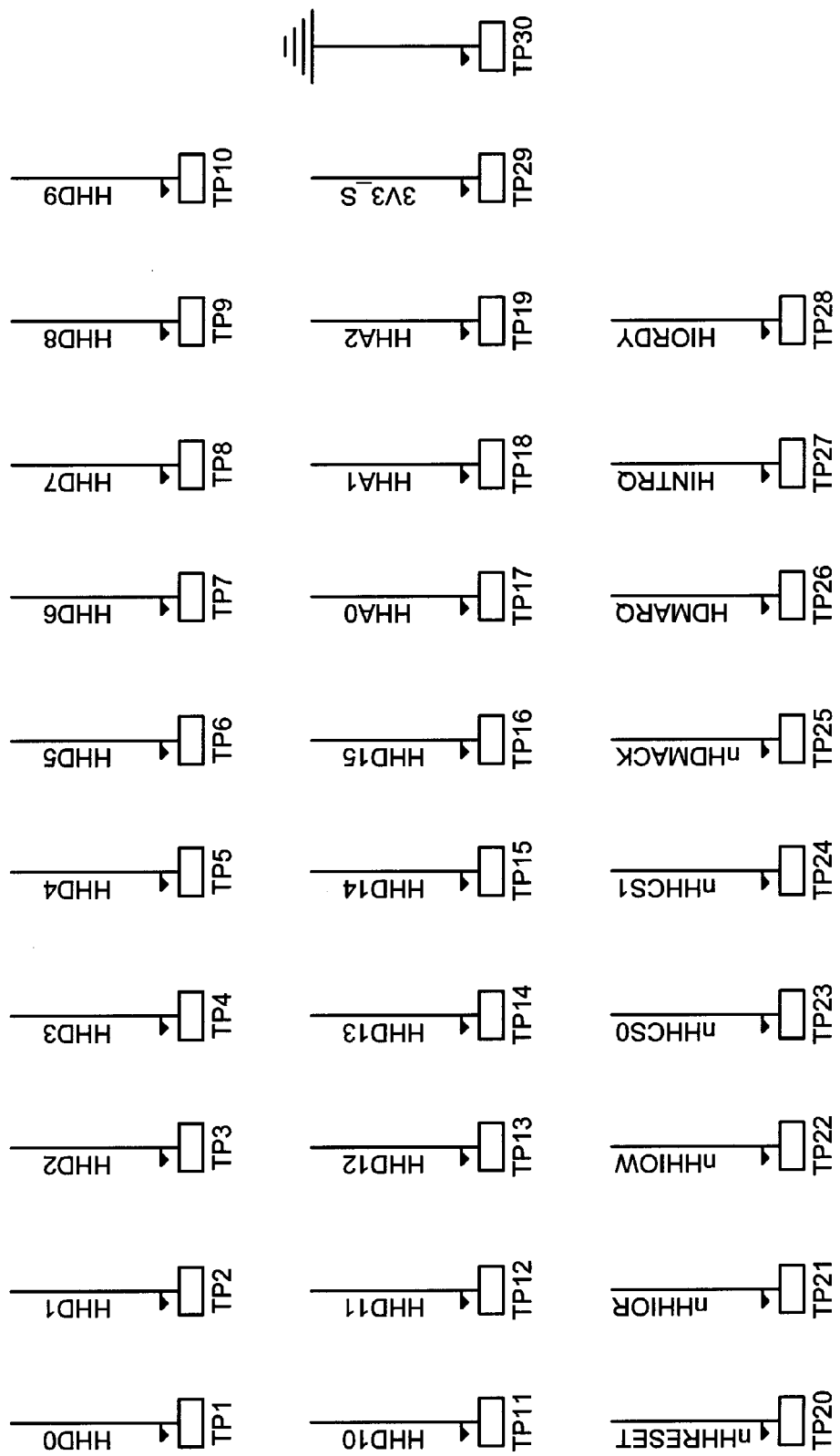
FIG. 5 is a diagram showing one example of names of signals transmitted to individual test pads 4 of FIG. 2.

FIG. 5 is a diagram showing one example of names of signals transmitted to individual test pads 4 of FIG. 2.

Referring to FIG. 5, 30 pieces of test pads, TP1-TP30, can be provided as the test pads 4 shown in FIG. 2. In this arrangement, the test pad TP1 is connected to the pin P20 shown in FIG. 4; the test pad TP2 is connected to the pin P18; the test pad TP3 is connected to the pin P16; the test pad TP4 is connected to the pin P14; the test pad TP5 is connected to the pin P11; the test pad TP6 is connected to the pin P9; the test pad TP7 is connected to the pin P7; the test pad TP8 is connected to the pin P5; the test pad TP9 is connected to the pin P6; the test pad TP10 is connected to the pin P8; the test pad TP11 is connected to the pin P10; the test pad TP12 is connected to the pin P12; the test pad TP13 is connected to the pin P15; the test pad TP14 is connected to the pin P17; the test pad TP15 is connected to the pin P19; the test pad TP16 is connected to the pin P21; the test pad TP17 is connected to the pin P34; the test pad TP18 is connected to the pin P32; the test pad TP19 is connected to the pin P35; the test pad TP20 is connected to the pin P3; the test pad TP21 is connected to the pin P26; the test pad TP22 is connected to the pin P24; the test pad TP23 is connected to the pin P36; the test pad TP24 is connected to the pin P37; the test pad TP25 is connected to the pin P30; the test pad TP26 is connected to the pin P23; the test pad TP27 is connected to the pin P31; the test pad TP28 is connected to the pin P28; the test pad TP29 is connected to the power supply; and the test pad TP30 is connected to the ground.

Figure 6:
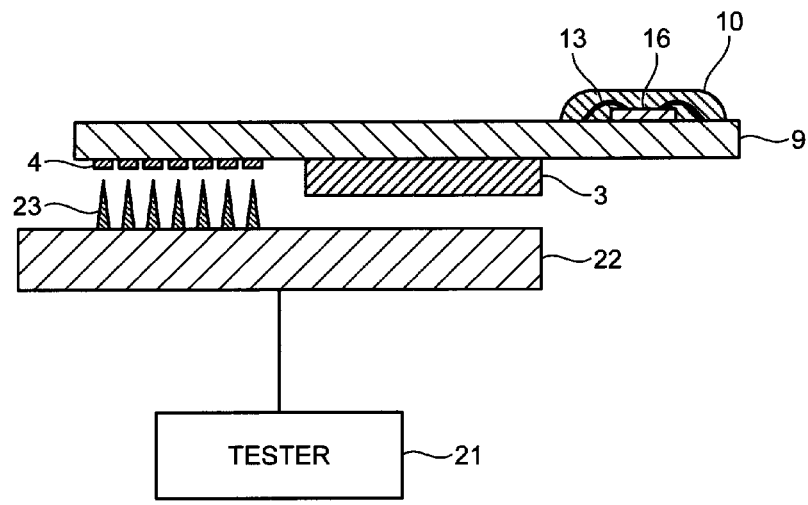
FIG. 6 is a cross sectional view illustrating a state of the memory module 2 of FIG. 1 during a test.

FIG. 6 is a cross sectional view illustrating a state of the memory module 2 of FIG. 1 during a test.

In FIG. 6, the semiconductor chip 16 for controller is mounted on the reverse side of the mounting board 9. The semiconductor chip 16 for controller is electrically connected to the mounting board 9 through bonding wires 13 and sealed with the encapsulating resin 10 together with the bonding wires 13.

Probes 23 are provided upright on a stage 22 and connected to a tester 21 through the stage 22. The probes 23 may be arranged in a position corresponding to the test pads 4 shown in FIG. 2.

When the memory module 2 is tested, the probes 23 are brought into contact with the test pads 4. Then, test signals are input to the controller 6 from the tester 21, and a response from the controller 6 is determined by the tester 21.

The memory module 2 can be subjected to several types of test while the tester 21 is changed. For example, it is possible to perform the separate tests such as the test on the controller 6 or the test on the entirety of the NAND memories 7a-7d.

By forming the test pads 4 on the mounting board 9, the memory module 2 can be tested by bringing the probes 23 in contact with the test pads 4. With this arrangement, insertion and removal of the cable 8 into and from the connector 3 will no longer be required when the memory module 2 is tested. This arrangement makes it possible to prevent the connector 3 from wear and attracting metallic particles thereon, and reduce instances of poor contact even when the pin pitch of the connector 3 is narrowed.

[Second Embodiment]

Figure 7:
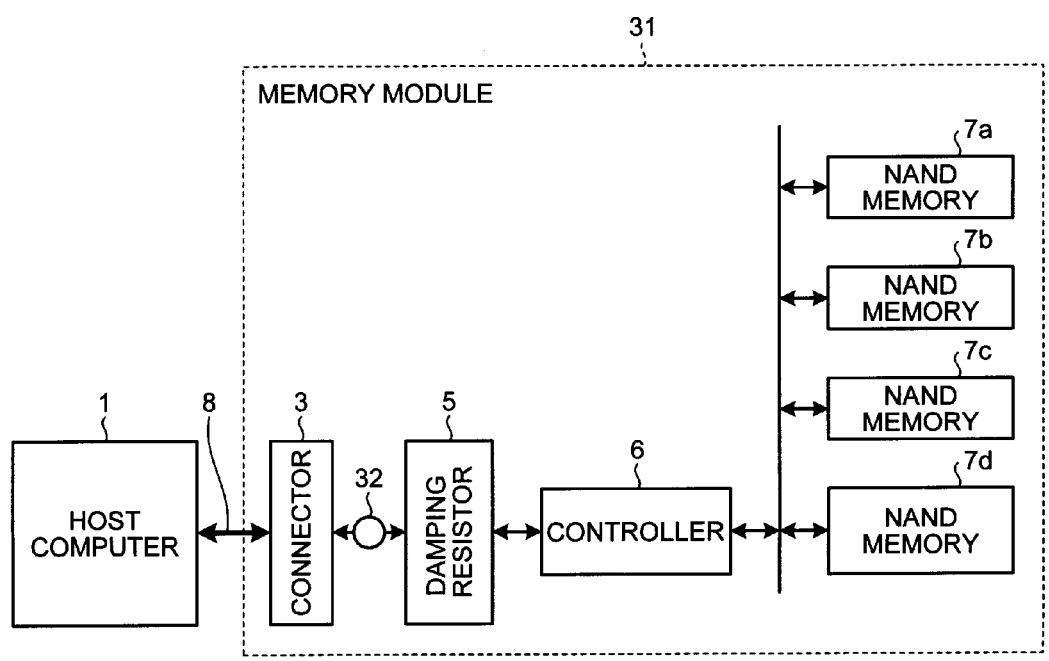
FIG. 7 is a block diagram illustrating an outline configuration of a memory module 31 according to a second embodiment.

FIG. 7 is a block diagram illustrating an outline configuration of a memory module 31 according to a second embodiment.

Referring to FIG. 7, the memory module 31 is provided with test pads 32 formed on the mounting board 9 instead of the test pads 4 of the memory module 2 shown in FIG. 1. Here, the test pads 32 are connected in series between the connector 3 and the damping resistor 5. With this arrangement, it is possible to arrange the memory module 31 to cope with a high transmission speed of 100 Mbits/sec or higher even when the test pads 32 are provided on the mounting board 9.

[Third Embodiment]

Figure 8B:
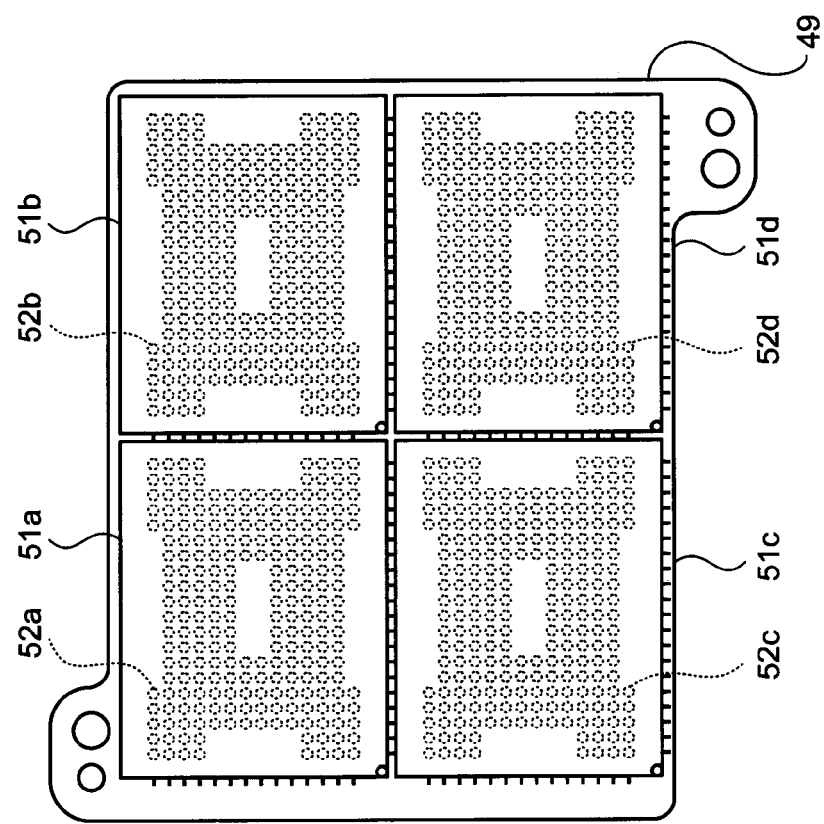
FIGS. 8A and 8B are diagrams illustrating an external structure of a memory module according to a third embodiment.
Figure 8A:
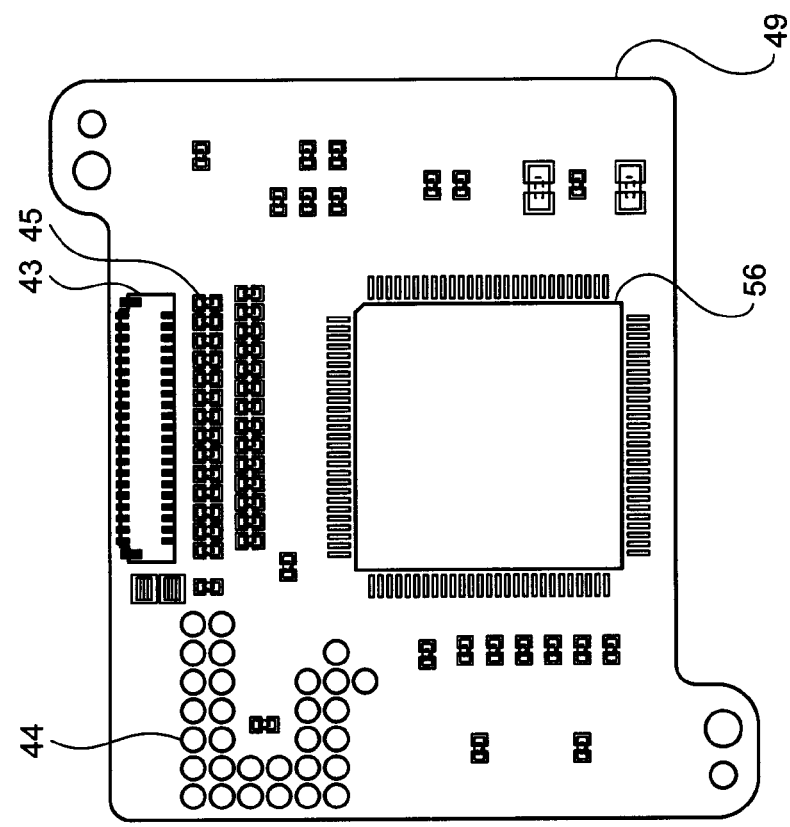

FIG. 8A is a rear view illustrating an external structure of a memory module according to a third embodiment, and FIG. 8B is a plan view illustrating an external structure of the memory module according to the third embodiment.

Referring to FIG. 8, NAND memory BGAs 51a-51d are mounted on the obverse side of a mounting board 49 by way of solder balls 52a-52d, respectively. Here, the NAND memory BGAs 51a-51d can be arranged in a form of two rows by two columns. The NAND memories 7a-7d illustrated in FIG. 1 can be mounted on the NAND memory BGAs 51a-51d, respectively. As a material of the mounting board 49, for example, PCB (polychlorinated biphenyl) can be used.

On the other hand, a connector 43 is mounted and test pads 44 are formed on the reverse side of the mounting board 49. At the same time, a damping resistor 45 is mounted on the same side where the connector 43 is mounted. A semiconductor package 56 for controller is also mounted on the reverse side of the mounting board 49. The controller 6 illustrated in FIG. 1 can be mounted in the semiconductor package 56 for controller. A QFP (quad flat package) can be used as the semiconductor package 56 for controller. The damping resistor 45 is positioned between the connector 43 and the semiconductor package 56 for controller, and the test pads 44 are arranged in a lateral direction beside the damping resistor 45 on the mounting board 49.

By mounting the semiconductor package 56 for controller and the NAND memory BGAs 51a-51d on each side of the mounting board 49, it is possible to increase the capacity of the memory that can be mounted on the mounting board 49 and miniaturize the memory module 2. At the same time, by mounting the NAND memory BGAs 51a-51d on one side of the mounting board 49, it is possible to perform a unit test on the NAND memories 7a-7d shown in FIG. 1 before they are mounted on the mounting board 49. This makes it possible to mount only the NAND memories 7a-7d that have passed the test on the mounting board 49 and increase manufacturing yield of the memory module 2.

Also, by forming the test pads 44 on the mounting board 49, it is no longer necessary to insert and remove the cable 8 into and from the connector 43 when the memory module 2 is tested. This arrangement makes it possible to prevent the connector 43 from wear and attracting metallic particles thereon, which contributes to reducing instances of poor contact even when the pin pitch of the connector 43 is narrowed.

It should be noted that, although the foregoing embodiments describe examples of a method in which the memory module 2 or 31 is used as an external storage device of the host computer 1, the memory module 2 or 31 may be used as an internal storage module of a digital video camera, a television set, a mobile information terminal, or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A module comprising:
a board;
a first memory on the board;
a second memory on the board, the second memory aligned with the first memory in a first direction;
a controller on the board, the controller separated from the first memory in a second direction that crosses the first direction;
a connector separated from the controller in the first direction, the connector extending in a longitudinal direction greater than a width direction, and the longitudinal direction of the connector being along the first direction, the controller aligned with and positioned along the longitudinal direction of the connector, the connector transferring a signal exchanged between the controller and outside of the module; and
a test pad separated from the connector in the first direction, the test pad transferring a test signal exchanged between the controller and outside, wherein
the test pad is led out from a connection between the connector and the controller.

2. The module according to claim 1,
wherein the connector has 39 pins or more and a pin pitch in a range from 0.3 mm to 0.5 mm.

3. The module according to claim 1,
wherein the first memory and the second memory are mounted on obverse and reverse sides of the board.

4. The module according to claim 3,
wherein the first memory and the second memory are placed next to each other in the first direction of the board.

5. The module according to claim 4, further comprising a damping resistor that is connected between the test pad and the controller.

6. The module according to claim 5,
wherein the damping resistor is placed between the connector and the controller either on the obverse side or the reverse side of the board.

7. The module according to claim 5,
wherein the board is formed of a four-layer board such that a first layer and a fourth layer of the board are used as a wiring layer, a second layer is used as a ground layer, a third layer is used as a power supply layer, and wiring connecting between the test pad and the connector is also formed in the second layer.

8. The module according to claim 5,
wherein the first memory and the second memory are arranged in a form of a BGA (ball grid array), and
the controller is mounted by a COB (chip on board) technology on the board.

9. The module according to claim 8,
wherein the first memory and the second memory are used as external storage devices of a host computer.

10. The module according to claim 9,
further comprising a cable that connects the host computer and the module,
wherein the cable comprises wiring retained by a carrier tape, and external terminals that are formed at both ends of the carrier tape and connected to the wiring.

11. The module according to claim 1,
wherein the connector is provided on a first face side of the board on which the controller is provided.

12. The module according to claim 1,
wherein the connector is provided on an opposite side of a first face side of the board on which the controller is provided.

13. A module comprising:
a board;
a first memory on the board;
a second memory on the board, the second memory aligned with the first memory in a first direction;
a controller on the board, the controller separated from the first memory in a second direction that crosses the first direction;
a connector separated from the controller in the first direction, the connector extending in a longitudinal direction greater than a width direction, and the longitudinal direction of the connector being along the first direction, the controller aligned with and positioned along the longitudinal direction of the connector, the connector transferring a signal exchanged between the controller and outside of the module; and
a test pad separated from the connector in the first direction, the test pad transferring a test signal exchanged between the controller and outside,
wherein the test pad is connected in series between the connector and the controller.

14. A module comprising:
a board;
a first memory on an obverse side of the board;
a second memory on a reverse side of the board, the second memory overlying on the first memory;
a controller on the obverse side of the board; and
a connector on the reverse side of the board, the connector extending in a longitudinal direction greater than a width direction, the connector being separated from the controller in the longitudinal direction of the connector, the controller aligned with and positioned along the longitudinal direction of the connector, the connector transferring a signal exchanged between the controller and outside of the module.

15. A module comprising:
a board;
a first memory on an obverse side of the board;
a second memory on the obverse side of the board, the second memory being aligned with the first memory in a first direction;
a controller on a reverse side of the board; and
a connector on the reverse side of the board, the connector extending in a longitudinal direction greater than a width direction, the connector being aligned with the controller in the first direction, and the longitudinal direction of the connector being along the first direction, the controller aligned with and positioned along the longitudinal direction of the connector, the connector transferring a signal exchanged between the controller and outside of the module.

16. A module comprising:
a board;
a first memory on the board;
a second memory on the board, the second memory being aligned with the first memory in a first direction;
a controller on the board, the controller being separated from the first memory in a second direction that crosses the first direction; and
a connector separated from the controller in the first direction, the connector extending in a longitudinal direction greater than a width direction, and the longitudinal direction of the connector being along the first direction, the controller aligned with and positioned along the longitudinal direction of the connector, the connector transferring a signal exchanged between the controller and outside of the module.

* * * * *